United States Patent
Kutsukake

(10) Patent No.: US 8,334,557 B2
(45) Date of Patent: Dec. 18, 2012

(54) NONVOLATILE SEMICONDUCTOR STORAGE DEVICE INCLUDING A TRANSFER TRANSISTOR

(75) Inventor: Hiroyuki Kutsukake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 12/857,858

(22) Filed: Aug. 17, 2010

(65) Prior Publication Data

US 2011/0073926 A1 Mar. 31, 2011

(30) Foreign Application Priority Data

Sep. 25, 2009 (JP) ................................. 2009-221363

(51) Int. Cl.
*H01L 29/792* (2006.01)
(52) U.S. Cl. .................................. 257/314; 257/E21.41
(58) Field of Classification Search .......... 257/314–316, 257/E21.41; 365/185.17
See application file for complete search history.

(56) References Cited

U.S. PATENT DOCUMENTS

| | | | |
|---|---|---|---|
| 6,621,735 B2 | 9/2003 | Nakamura et al. | |
| 7,630,224 B2 | 12/2009 | Takahashi | |
| 7,839,686 B2 * | 11/2010 | Shibata | 365/185.17 |
| 7,843,726 B2 * | 11/2010 | Roohparvar et al. | 365/185.03 |
| 2006/0146610 A1 * | 7/2006 | Takeuchi et al. | 365/185.17 |
| 2006/0158936 A1 * | 7/2006 | Nakamura et al. | 365/185.17 |
| 2007/0057310 A1 * | 3/2007 | Matsui et al. | 257/314 |
| 2007/0058433 A1 * | 3/2007 | Takeuchi et al. | 365/185.17 |
| 2007/0069290 A1 * | 3/2007 | Houston et al. | 257/345 |
| 2007/0133259 A1 * | 6/2007 | Kim | 365/149 |
| 2007/0207575 A1 * | 9/2007 | Taniguchi et al. | 438/199 |
| 2007/0217264 A1 * | 9/2007 | Samachisa | 365/185.19 |
| 2008/0093677 A1 * | 4/2008 | Kim et al. | 257/390 |
| 2009/0161427 A1 | 6/2009 | Nakamura et al. | |
| 2009/0231902 A1 * | 9/2009 | Takashima | 365/145 |

FOREIGN PATENT DOCUMENTS

| | | |
|---|---|---|
| JP | 2-371 | 1/1990 |
| JP | 9-8226 | 1/1997 |
| JP | 9-260669 | 10/1997 |
| JP | 2002-63795 | 2/2002 |
| JP | 2003-124338 | 4/2003 |
| JP | 2008-198866 | 8/2008 |
| JP | 2009-152388 | 7/2009 |

OTHER PUBLICATIONS

Japanese Office Action issued Jan. 31, 2012 in patent application No. 2009-221363 with English translation.

* cited by examiner

*Primary Examiner* — Nathan Ha
(74) *Attorney, Agent, or Firm* — Oblon, Spivak, McClelland, Maier & Neustadt, L.L.P.

(57) ABSTRACT

A first diffused region is formed in a surface of a semiconductor substrate located under a gate electrode. A second diffused region is formed in a surface of the semiconductor substrate adjoining the first diffused region on a first side thereof. A third diffused region is formed in a surface of the semiconductor substrate adjoining the first diffused region on a second side thereof. The first side and the second side are opposite to one another. A first wire is disposed above an overlapping region where the first and third diffused regions overlap. The first wire is supplied with at least a certain voltage for preventing formation of a depletion region in the third diffused region when transfer transistor transfers the voltage used for writing.

17 Claims, 12 Drawing Sheets

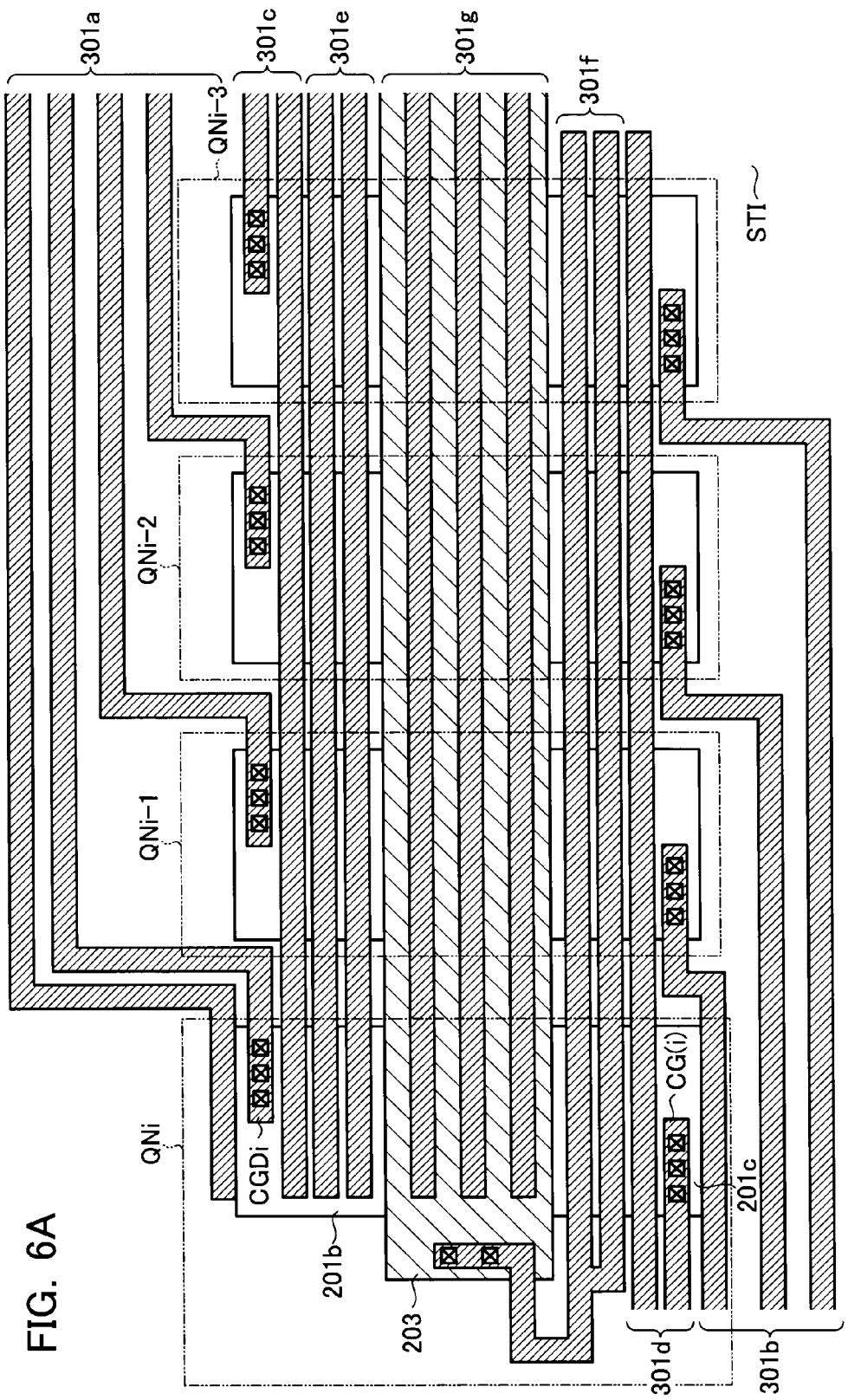

FIRST COMPARATIVE
EXAMPLE S1
[DRAIN SIDE OF TRANSFER
TRANSISTOR QNi]

SECOND COMPARATIVE
EXAMPLE S2
[DRAIN SIDE OF TRANSFER
TRANSISTOR QNi]

THIRD COMPARATIVE
EXAMPLE S3
[DRAIN SIDE OF TRANSFER
TRANSISTOR QNi]

FOURTH COMPARATIVE
EXAMPLE S4
[DRAIN SIDE OF TRANSFER
TRANSISTOR QNi]

FIFTH COMPARATIVE EXAMPLE S5
[DRAIN SIDE OF TRANSFER TRANSISTOR QNi]

SIXTH COMPARATIVE EXAMPLE S6
[DRAIN SIDE OF TRANSFER TRANSISTOR QNi]

SEVENTH COMPARATIVE EXAMPLE S7
[DRAIN SIDE OF TRANSFER TRANSISTOR QNi]

EIGHTH COMPARATIVE EXAMPLE S8
[DRAIN SIDE OF TRANSFER TRANSISTOR QNi]

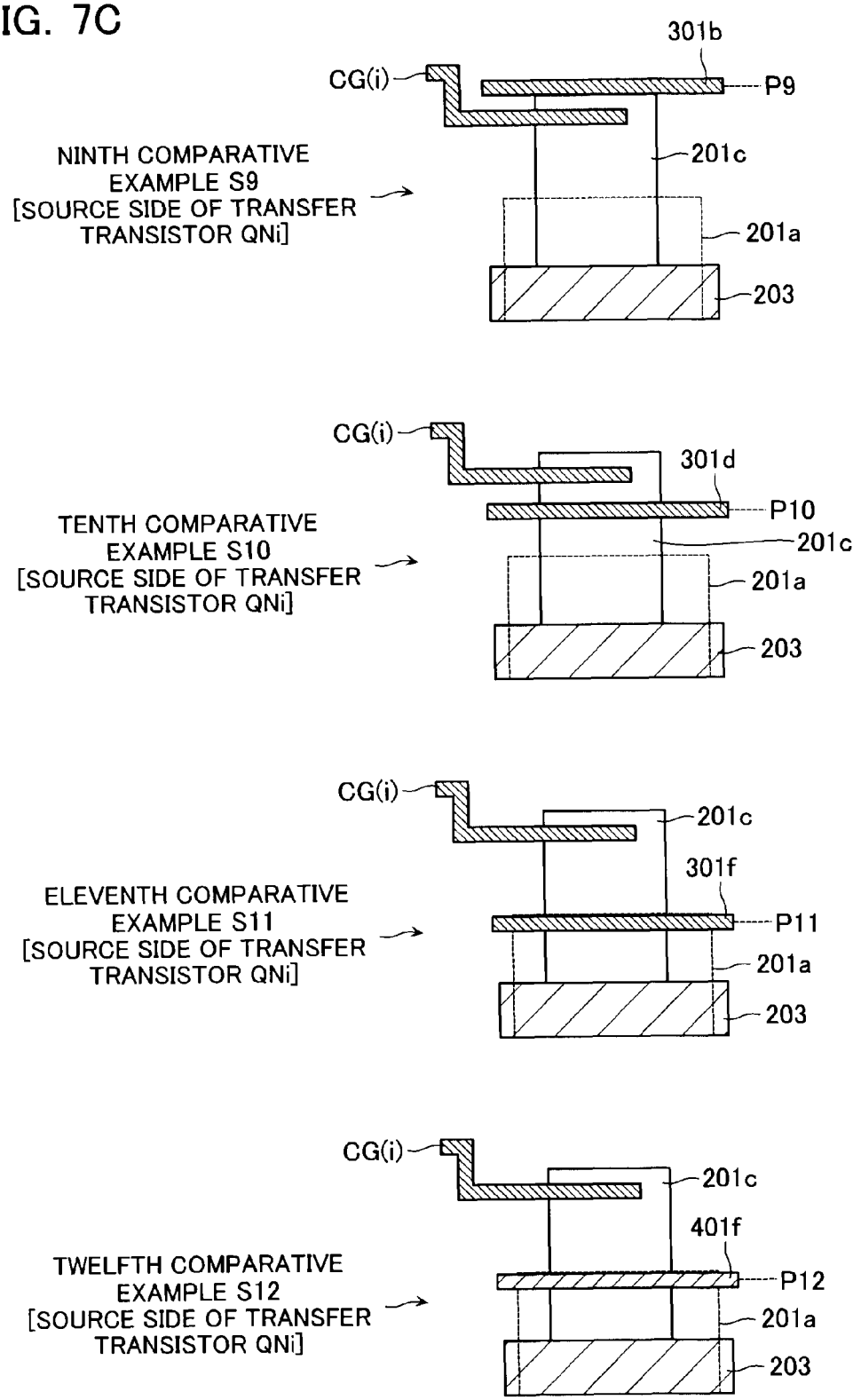

THIRTEENTH COMPARATIVE EXAMPLE S13
[SOURCE SIDE OF TRANSFER TRANSISTOR QNi]

FOURTEENTH COMPARATIVE EXAMPLE S14
[SOURCE SIDE OF TRANSFER TRANSISTOR QNi]

FIFTEENTH COMPARATIVE EXAMPLE S15
[SOURCE SIDE OF TRANSFER TRANSISTOR QNi]

SIXTEENTH COMPARATIVE EXAMPLE S16
[SOURCE SIDE OF TRANSFER TRANSISTOR QNi]

NONVOLATILE SEMICONDUCTOR STORAGE DEVICE INCLUDING A TRANSFER TRANSISTOR

CROSS REFERENCE TO RELATED APPLICATIONS

This application is based upon and claims the benefit of priority from the prior Japanese Patent Application No. 2009-221363, filed on Sep. 25, 2009, the entire contents of which are incorporated herein by reference.

BACKGROUND OF THE INVENTION

1. Field of the Invention

The present invention relates to a nonvolatile semiconductor memory device, and more particularly to a nonvolatile semiconductor memory device including transfer transistors that transfer a high voltage.

2. Description of the Related Art

Conventionally, as one kind of semiconductor memory devices, NAND cell type flash memories in which a plurality of memory cells capable of storing information in a nonvolatile manner are connected in series and constitute a NAND cell block have been drawing attention as they are suitable for high integration. One memory cell of a NAND cell type flash memory has a FETMOS structure in which a floating gate (charge storage layer) and a control gate are stacked above a semiconductor substrate via insulating films. A plurality of such memory cells are connected in series in a way that the source of one memory cell is shared as the drain of its adjoining memory cell, thereby constituting a NAND cell, which is a unit to be connected to a bit line. Such NAND cells are arranged in a matrix and constitute a memory cell array. The memory cell array is integrally formed within a p-type semiconductor substrate or a p-type well region. NAND cells aligned in the column direction of the memory cell array have their drains at one end thereof connected in common to a bit line via selector gate transistors respectively, and their sources at the other end thereof connected to common source lines likewise via selector gate transistors respectively. The control gates of the memory transistors and the gate electrodes of the selector gate transistors that are aligned along the row direction of the memory cell array are connected in common as control gate lines (word lines) or selector gate lines, respectively.

In a data writing operation, the NAND cell type flash memory transfers a voltage higher than a power supply voltage to a selected control gate line in a selected block and to non-selected control gate lines in the selected block. In order to transfer such a high voltage to the memory cells, conventional NAND cell type flash memories have a row decoder circuit including transfer transistors having a high dielectric strength (e.g., see JP2002-63795A). Peripheral circuits other than the row decoder also include many transfer transistors that transfer such a high voltage.

Flash memories have as small an area as possible not only for the cell array but also for surrounding peripheral circuits to shrink and store multivalue data (MLC: multi-level cells). Further, the row decoder can transfer a high writing potential to deal with multivalue writing.

SUMMARY OF THE INVENTION

A nonvolatile semiconductor memory device according to the present invention includes: a memory cell array having memory cells arranged therein, the memory cells being configured to store data in a nonvolatile manner; and a plurality of transfer transistors configured to transfer a voltage supplied for writing data in the memory cells, the plurality of transfer transistors including: a gate electrode formed above a semiconductor substrate via a gate insulating film; a first diffused region formed in a surface of the semiconductor substrate located under the gate electrode; a second diffused region formed in a surface of the semiconductor substrate adjoining the first diffused region; and a third diffused region formed in a surface of the semiconductor substrate in a manner to sandwich the first diffused region with the second diffused region, the third diffused region including an overlapping region overlapping the first diffused region, a first wire being disposed above the overlapping region, the first wire being supplied with at least a predetermined voltage for preventing formation of a depletion region in the third diffused region when the transfer transistor transfers the voltage used for writing.

BRIEF DESCRIPTION OF THE DRAWINGS

FIG. 6A is a plan diagram of transfer transistors QNi to QNi-3 (i=4 to n, the same applies hereinafter) according to an embodiment of the present invention;

FIG. 7C shows plan diagrams of configurations of the transfer transistor QNi according to comparative examples.

DETAILED DESCRIPTION OF THE EMBODIMENTS

An embodiment of the present invention will now be explained with reference to the drawings.

Embodiment

Figure 1:
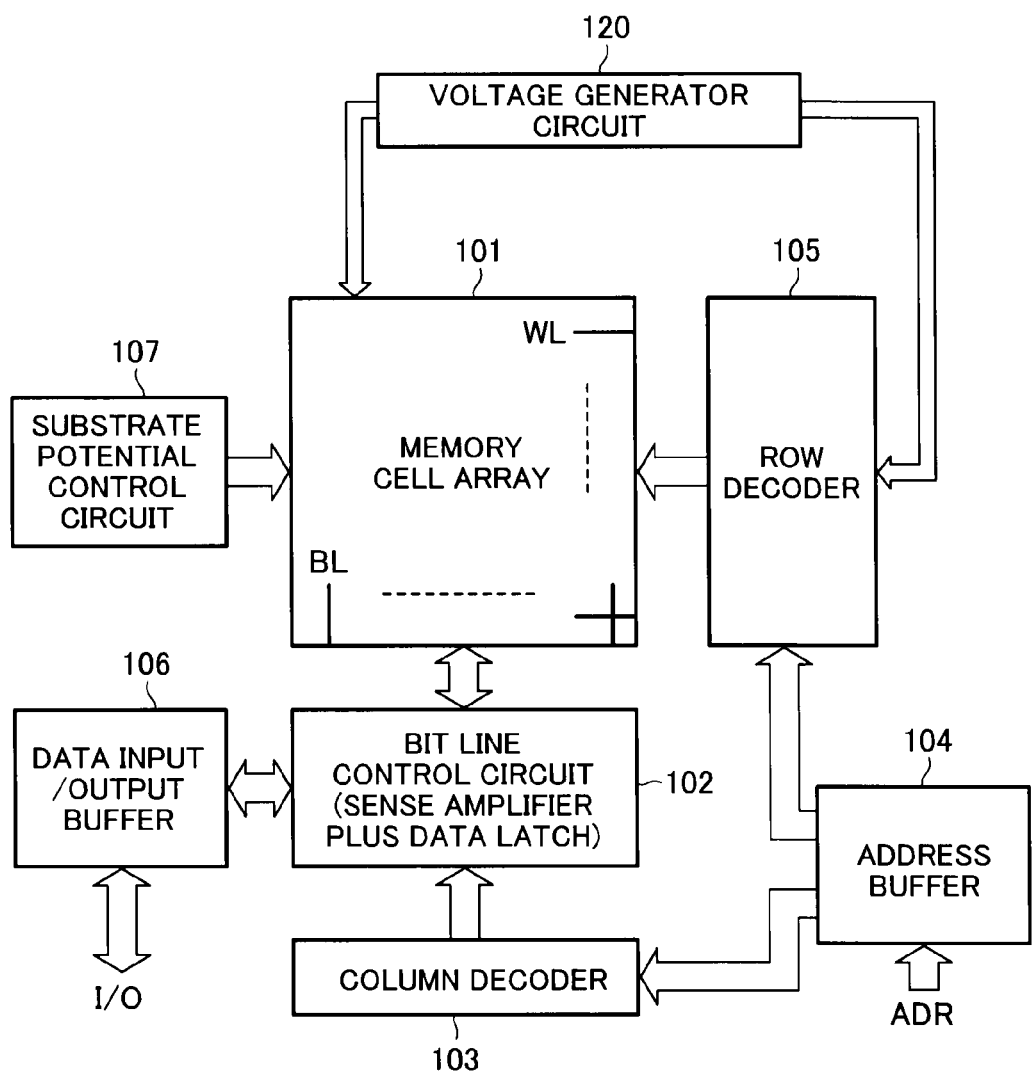
FIG. 1 is a block diagram showing a schematic configuration of a NAND cell type flash memory according to an embodiment of the present invention.

FIG. 1 is a block diagram showing a schematic configuration of a NAND cell type flash memory according to an embodiment of the present invention.

A bit line control circuit (sense amplifier plus data latch) 102 is provided, which executes data writing/reading/rewriting, and verify-reading to a memory cell array 101. The bit line control circuit 102 is connected to a data input/output buffer 106, and receives as an input thereto, an output of a column decoder 103 which receives an address signal from an address buffer 104.

Also provided are a row decoder 105, which has control over control gates and selector gates of the memory cell array 101, and a substrate potential control circuit 107, which controls the potential of a p-type silicon substrate (or a p-type well region) within which the memory cell array 101 is formed. There is also provided a voltage generator circuit 120, as a circuit that generates a voltage necessary for writing, reading, etc., which is to be supplied to the memory cells, etc.

The bit line control circuit 102 is mainly constituted by a CMOS flip flop, and executes latching of data to be written, a sensing operation for reading the potential of a bit line, a sensing operation for a verify-reading operation after a writing operation, and latching of data to be rewritten.

Figure 2A:
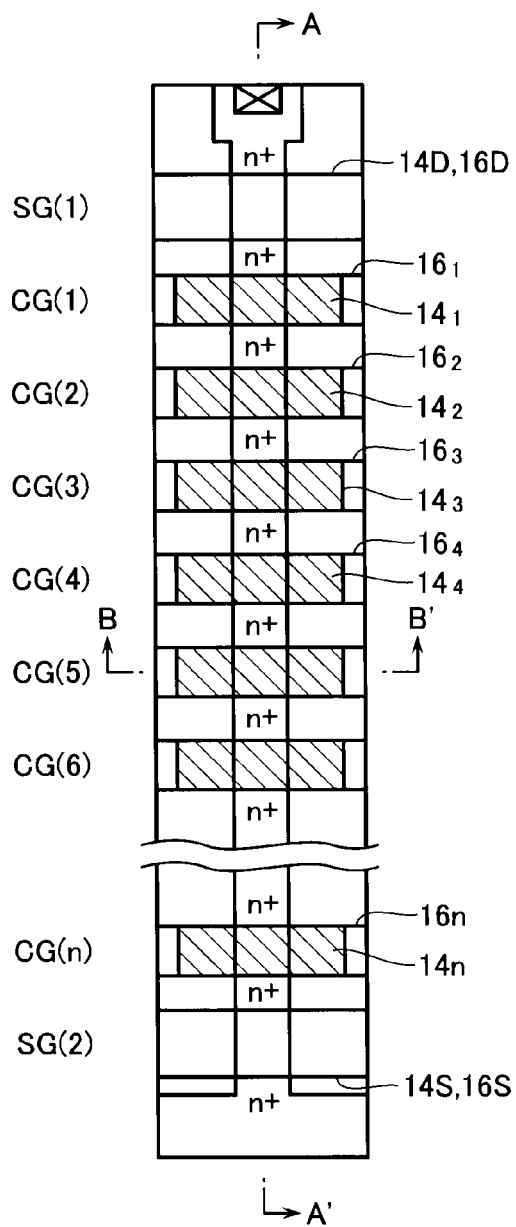
FIG. 2A is a plan diagram of one NAND cell in a memory cell array 101 of FIG. 1.
Figure 2B:
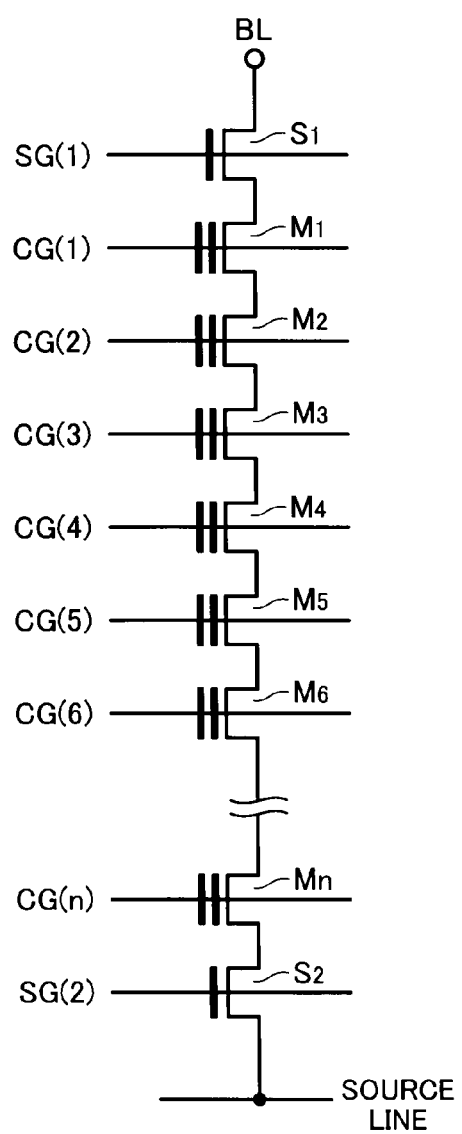
FIG. 2B is an equivalent circuit diagram of one NAND cell in the memory cell array 101.
Figure 3A:
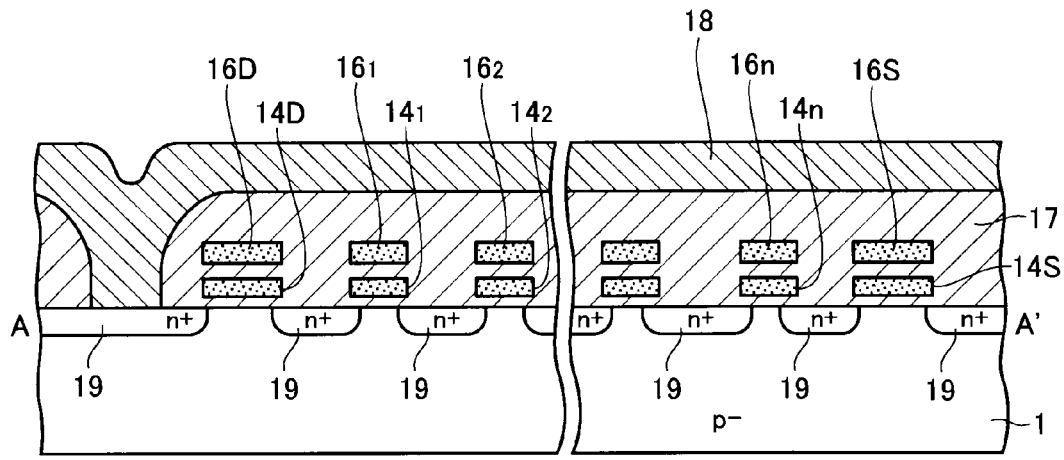
FIG. 3A is a cross section of FIG. 2A taken along a line A-A'.
Figure 3B:
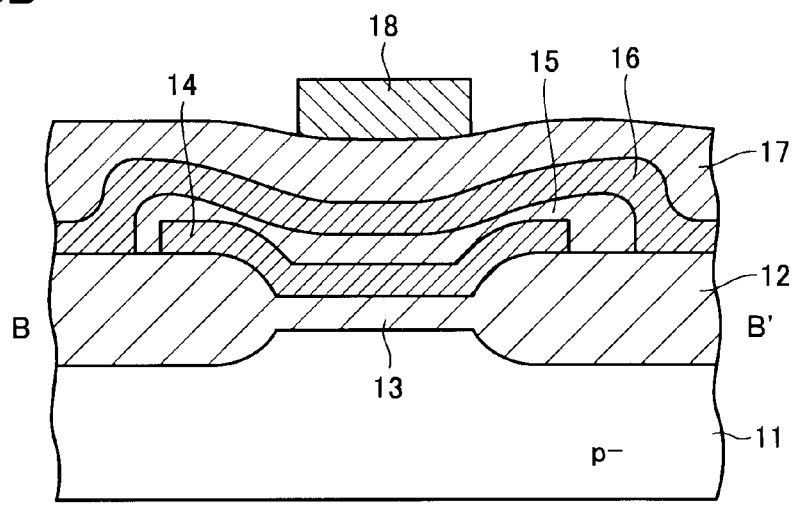
FIG. 3B is a cross section of FIG. 2A taken along a line B-B'.

FIG. 2A and FIG. 2B are a plan diagram and an equivalent circuit diagram respectively, of one NAND cell in the memory cell array 101. FIG. 3A and FIG. 3B are cross sections of FIG. 2A taken along a line A-A' and a line B-B' respectively. The memory cell array formed of a plurality of NAND cells is formed within the p-type silicon substrate (or p-type well region) 11 surrounded by an element isolating oxide film 12. To explain by focusing on one NAND cell, in the present embodiment, for example, "n" memory cells M1 to Mn are connected in series to form one NAND cell.

Each of the memory cells M1 to Mn comprises a floating gate 14 ($14_1$, $14_2$, . . . , $14_n$), which is formed above the substrate 11 via a gate insulating film 13, and a control gate 16 (=a word line: $16_1$, $16_2$, . . . , $16_n$), which is formed above the floating gate 14 via an insulating film 15. N-type diffused layers 19, which function as sources and drains of these memory cells, are connected in a way that each diffused layer is shared by adjoining memory cells, thereby connecting the memory cells in series.

Selector gates 14D and 16D, and 14S and 16S, which are formed at the same time as the floating gates and control gates of the memory cells, are provided at the drain side and source side of the NAND cell respectively, thereby forming selector transistors S1 and S2.

The substrate 11, on which the elements are formed, is covered with an insulating film 17, on which a bit line 18 is provided. The bit line 18 is connected to a drain-side diffused layer 19 at one end of the NAND cell. The control gates 16 of NAND cells arranged in the row direction are laid as common control gate lines CG(1), CG(2), . . . , and CG(n). These control gates function as word lines. The selector gates 14D and 16D, and 14S and 16S which are continuous in the row direction are also laid as selector gate lines SG(1) and SG(2) respectively.

Figure 4:
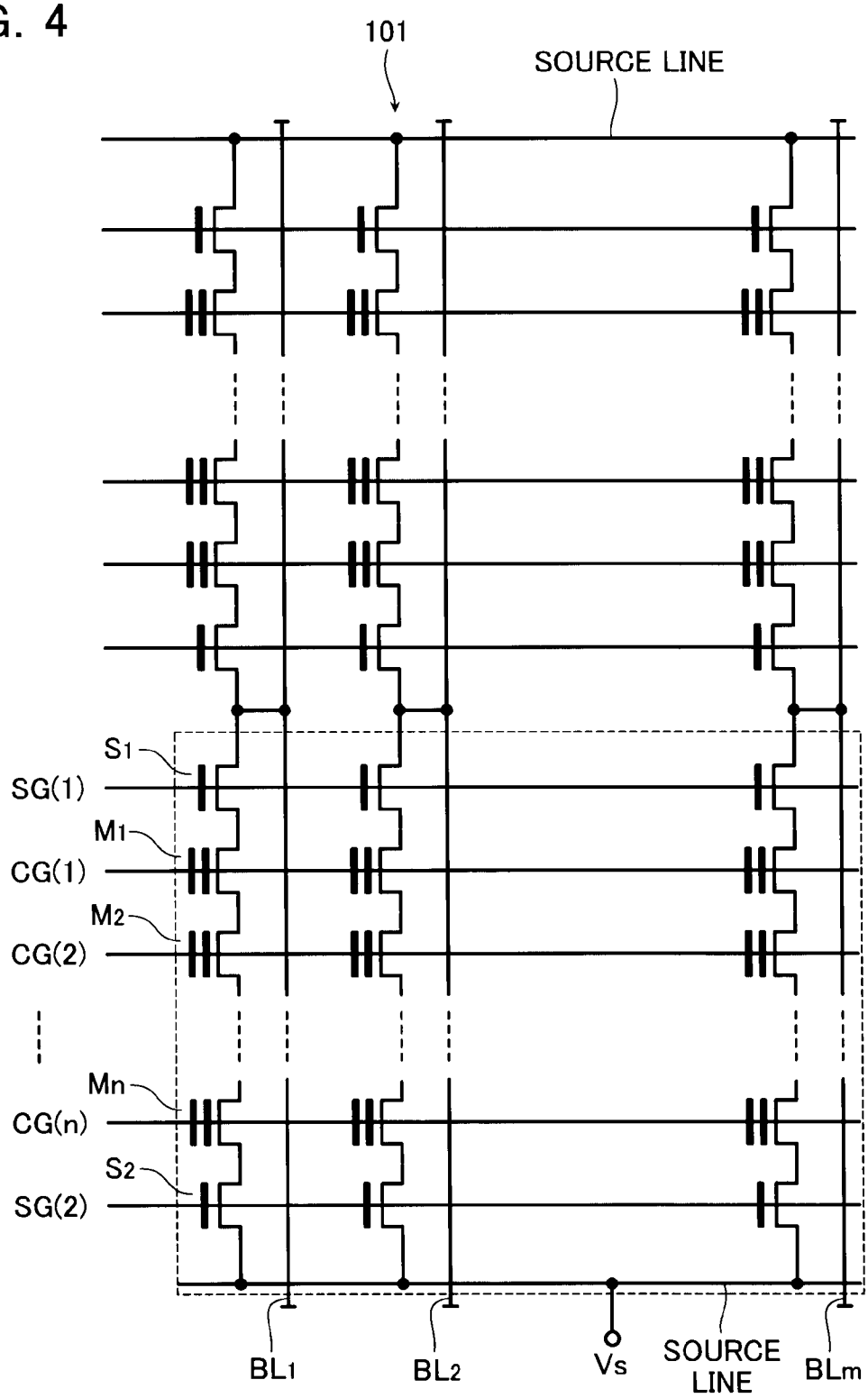
FIG. 4 shows an equivalent circuit of the memory cell array 101 having NAND cells in a matrix formation.

FIG. 4 shows an equivalent circuit of the memory cell array 101 in which such NAND cells are arranged in a matrix formation. A region enclosed by a dotted line in FIG. 4, in which NAND cells that share the same word lines and selector gate lines in common are included, is referred to as one block. In a normal reading/writing operation, only one of a plurality of blocks is selected (the only one block is referred to as selected block).

Figure 5:
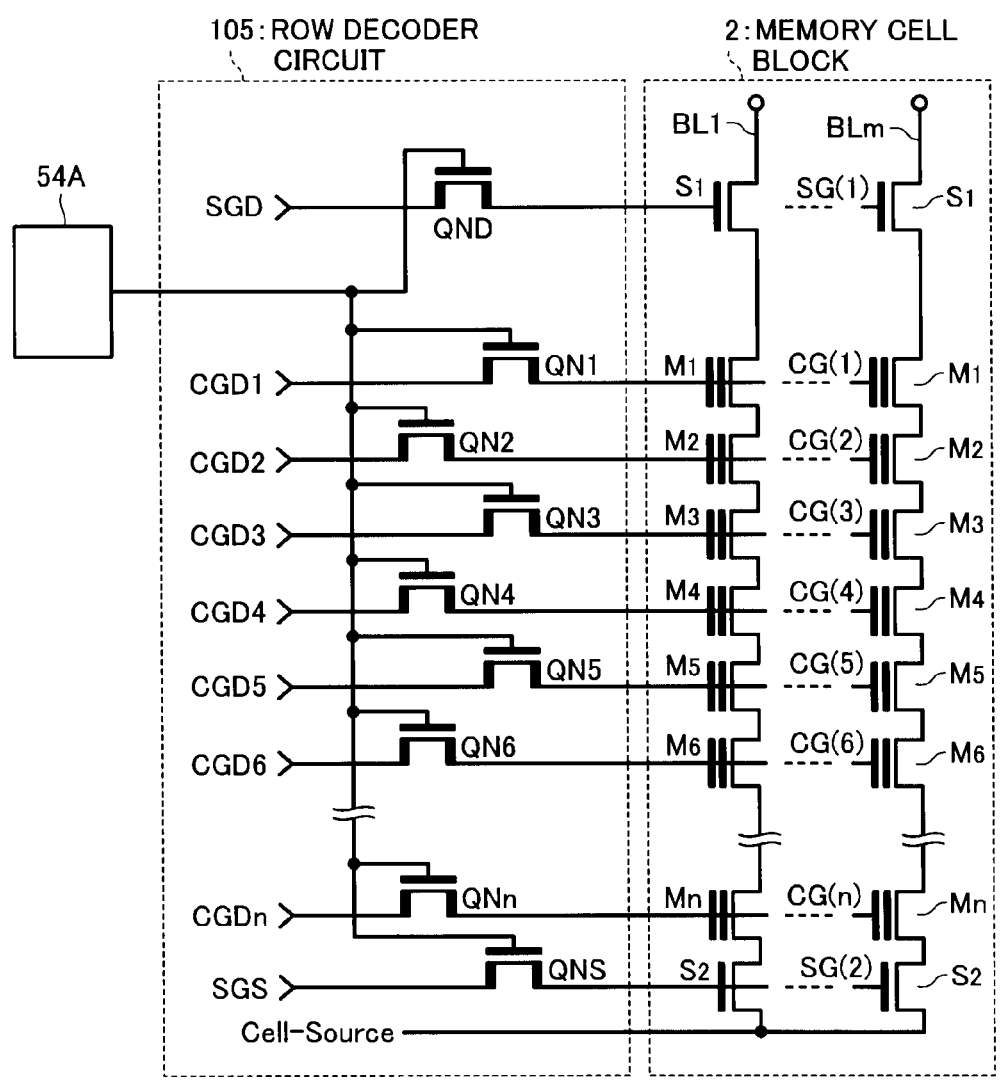
FIG. 5 is a diagram showing an example configuration of a row decoder 105 shown in FIG. 1.

FIG. 5 shows an example configuration of the row decoder 105. FIG. 5 shows a case where a row decoder circuit constituting the row decoder 105 is disposed at one side of one memory cell block 2 included in the memory cell array 101. The row decoder circuit 105 comprises transfer transistors QN1 to QNn, QND, and QNS connected to the control gate lines CG(1) to CG(n) and the selector gate lines SG(1) and SG(2). The transfer transistors QN1 to QNn are connected in one-to-one to the control gate lines CG(1) to CG(n).

That is, current paths of the transfer transistors QN1 to QNn are formed between the control gate lines CG(1) to CG(n) and their signal input nodes CGD1 to CGDn respectively. A current path of the transfer transistor QND is formed between the selector gate line SG(1) and its signal input node SGD. A current path of the transfer transistor QNS is formed between the selector gate line SG(2) and its signal input node SGS. A voltage switching circuit 54A is further provided, which switches the voltages of the control gate lines CG(1) to CG(n) and the selector gate lines SG(1) and SG(2) by setting the gate voltages of the transfer transistors QN1 to QNn, QND, and QNS. Note that the transfer transistors QN1 to QNn, QND, and QNS are all enhancement-type n-type MOS transistors.

As described above, the row decoder circuit 105 comprises the transfer transistors QN1 to QNn, QND, and QNS that transfer a high voltage such as a high writing voltage (20V or higher) to the word lines WL and the selector gate lines SG(1) and SG(2). Such transistors that transfer a high voltage are provided not only in the row decoder circuit 105 but also in, for example, the substrate potential control circuit 107, the voltage switching circuit 54A, etc. described above.

In case these transfer transistors QN1 to QNn, QND, and QNS transfer a high voltage VD from their drain-side nodes (if these transistors are n-channel type MOSFETs), a voltage (VD+Vth) which is a sum of the voltage VD and a threshold voltage Vth of the transfer transistors QN1 to QNn, QND and QNS, is applied to their gate electrodes. As a result, the potential of the source side of these transistors becomes the desired potential VD. Note that unless otherwise particularly defined, the threshold voltage Vth refers to the threshold voltage of the transfer transistors QN1 to QNn.

FIG. 6A is a plan diagram of a transfer transistor QNi (i=4 to n, the same applies hereinafter) according to an embodiment. FIG. 6A shows a plan diagram of a plurality of transfer transistors QNi to QNi-3. As shown in FIG. 6A, the plurality of transfer transistors QNi to QNi-3 are separated by element isolating regions STI. The plurality of transfer transistors QNi to QNi-3 are arranged to share a gate electrode 203. Alternatively, they may have divided gate electrodes respectively, which may be electrically connected by an upper layer wire.

Figure 6B:
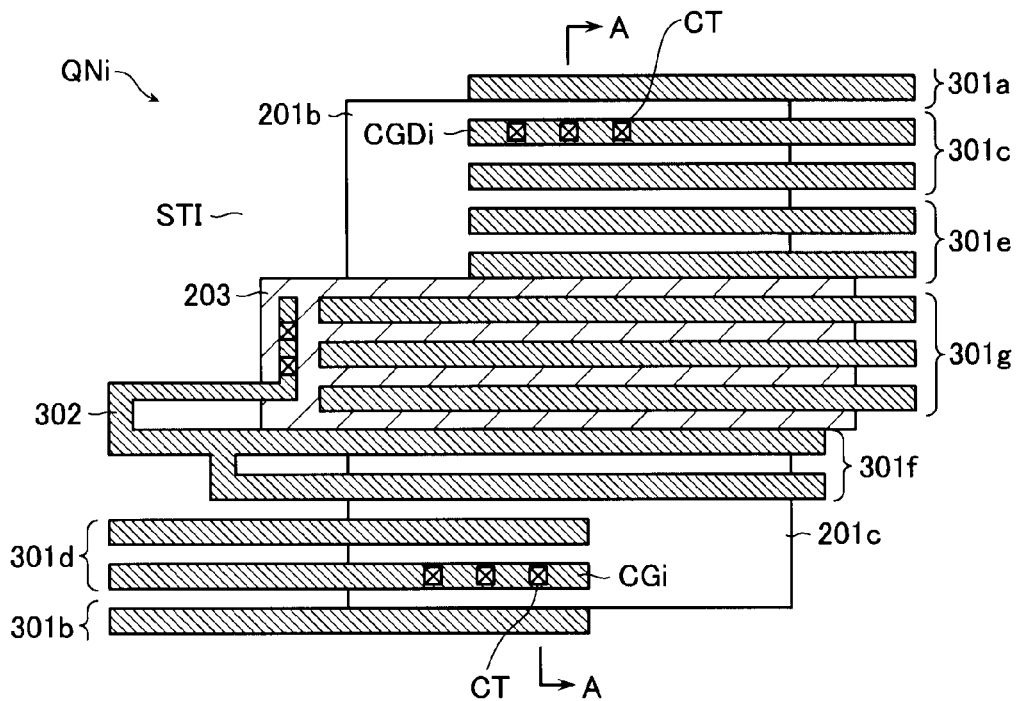
FIG. 6B is an expanded plan diagram of FIG. 6A showing the transfer transistor QNi.
Figure 6C:
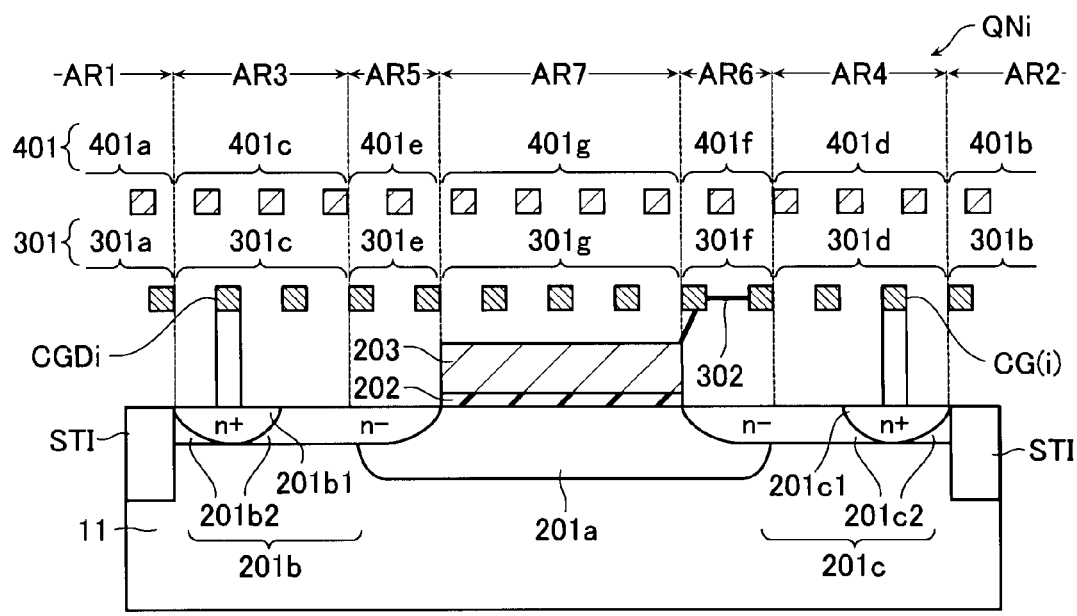
FIG. 6C is a cross section of FIG. 6B taken along a line A-A.

FIG. 6B is an expanded plan diagram of FIG. 6A showing the transfer transistor QNi. FIG. 6C is a cross section of FIG. 6B taken along a line A-A. The transfer transistor QNi has a gate electrode 203, which is formed above the p-type silicon substrate 11 via a gate insulating film 202. The transfer transistor QNi also has a p-type base diffused region 201a, and a n-type drain diffused region 201b and a source diffused region 201c in the surface of the silicon substrate 11. The base diffused region 201a includes regions that overlap the drain diffused region 201b and source diffused region 201c, when seen from the top.

The base diffused region 201a is located under the gate electrode 203 and can form a channel of the transfer transistor QNi. The drain diffused region 201b is formed to adjoin the base diffused region 201a, and functions as a drain of the transfer transistor QNi. The source diffused region 201c is formed to adjoin the base diffused region 201a and sandwich the base diffused region 201a between itself and the drain diffused region 201b, and functions as a source of the transfer transistor QNi. The drain diffused region 201b includes a higher concentration region 201b1 and an LDD region 201b2. Likewise, the source diffused region 201c includes a higher concentration region 201c1 and an LDD region 201c2. The LDD region 201b2 and the LDD region 201c2 may be formed to extend to under end portions of the gate electrode 203.

A signal input node CGDi is connected to the drain diffused region 201b through a contact CT, and a control gate CG(i) is connected to the source diffused region 201c through a contact CT.

Multiple M0 wires 301 which are irrelevant to the operation of the transfer transistor QNi (for example, M0 wires 301 that are not connected to the signal input node CGDi and the control gate line CGi) are provided above the transfer transistor QNi. Examples of the M0 wires 301 include a lead wire to a transfer transistor QNj having a control gate CG(j) (j=1 to n, an integer other than i), etc. For example, in FIG. 6A, such a lead wire may be an M0 wire 301 of the transfer transistor QNi-1 adjoining the transfer transistor QNi. Other examples of the M0 wires 301 irrelevant to the operation of the transfer transistor QNi include M0 wires (lead wires) connected to the transfer transistors QND and QNS. Particularly, in a writing operation to the memory cells M1 to Mn, the transfer transistor QNS transfer a ground potential. Therefore, the M0 wire connected to the transfer transistor QNS is set to the ground potential.

The M0 wires 301 are roughly classified into M0 wires 301a to 301g, each of which is provided in one of the divided seven regions AR1 to AR7.

The M0 wire 301a is formed in the region AR1, which is above an element isolating region (insulating layer) that adjoins the drain diffused region 201b. The M0 wire 301b is formed in the region AR2, which is above an element isolating region (insulating layer) that adjoins the source diffused region 201c. A ground voltage or any other predetermined voltage may be applied to the M0 wires 301a and 301b.

The M0 wires 301c are formed in the region AR3, which is not above the base diffused region 201a and is above the drain diffused region 201b. The M0 wires 301d are formed in the region AR4, which is not above the base diffused region 201a and is above the source diffused region 201c. The M0 wires 301c and 301d connected to the contacts CT of the transfer transistor QNi (excluding M0 wires 301 connected to the contacts CT of the adjoining transfer transistor for QNi-1 or the like) are provided with the voltage of the signal input node CGDi and the voltage to be transferred to the control gate CG(i). A ground voltage or any other predetermined voltage may be applied to the M0 wire 301c that is not connected to the contact CT. A ground voltage or any other predetermined voltage may be applied to the M0 wire 301d that is not connected to the contact CT of the transfer transistor QNi, but it is preferred that the predetermined voltage be supplied thereto in order to prevent formation of a depletion region in the source diffused region 201c under the M0 wire 301d.

The M0 wires 301e are formed in the region AR5, which is above the base diffused region 201a and above the drain diffused region 201b. The M0 wires 301f are formed in the region AR6, which is above the base diffused region 201a and above the source diffused region 201c. A ground voltage or any other predetermined voltage may be applied to the M0 wires 301e. The M0 wires 301f are short-circuited to the gate electrode 203 through a short-circuiting wire 302. That is, the M0 wires 301f is supplied with a predetermined voltage, which is for preventing formation of a depletion region in the source diffused region 201c, when the transfer transistor QNi transfers a high voltage (for example, during the write operation).

The M0 wires 301g are formed in the region AR7, which is right above the gate electrode 203. A ground voltage or any other predetermined voltage may be applied to the M0 wires 301g.

Further, multiple M1 wires 401, which are irrelevant to the operation of the transfer transistor QNi, are provided above the M0 wires 301. The M1 wires 401 include M1 wires 401a to 401g, which are provided in the above-described regions AR1 to AR7. A ground voltage or any other predetermined voltage may be applied to the M1 wires 401a to 401g.

In the example of FIG. 6A, the gate electrode 203 and the M0 wires 301f are shared by a plurality of transfer transistors QNi to QNi-3. That is, the gate electrode 203 functions as the gates of the plurality of transfer transistors QNi to QNi-3, and these gates are commonly connected in the shape of a straight line extending in a predetermined direction. The M0 wires 301f are formed to pass through the region AR6 of the plurality of transfer transistors QNi to QNi-3 continuously. As a result, it is possible to lay out the M0 wires 301f efficiently.

ADVANTAGES

The M0 wires 301 might give an adverse influence on the operation of the transfer transistor QNi, depending on the level of the voltage applied thereto. Consideration will now be given to comparative examples, which do not include the short-circuiting wire 302 of the above embodiment, such that independent voltages are applied to the gate electrode 203 and the M0 wires 301f respectively. In such comparative examples, if the voltage applied to the M0 wires 301f is a voltage (e.g., a ground voltage (0V)) that is lower than the high voltage which the transfer transistor QNi is to transfer, the high voltage might not be transferred sufficiently, causing an erroneous operation of the flash memory.

That is, in the comparative examples, the M0 wires 301f to which 0V is applied might cause the depletion region is formed in the source diffused region 201c in case a predetermined gate voltage (VD+Vth) is supplied to the gate electrode 203 of the transfer transistor QNi so that the high voltage VD may be supplied from the drain and transferred to the source side. Depletion region in the source diffused region 201c might increase the resistance thereof, making it harder for the high voltage VD to be transferred to the source side. Particularly, when multivalue data is written in one memory cell MC, it might not be possible to secure a sufficient margin.

On the other hand, in the present embodiment, a predetermined gate voltage is supplied to the gate electrode 203, and the same voltage is supplied to the M0 wires 301f. Accordingly, when the transfer transistor QNi is to transfer the high voltage VD (a voltage used for writing), a high voltage VD+Vth is applied to the M0 wires 301f. This enables to prevent formation of a depletion region in the source diffused region 201c of the transfer transistor QNi and to transfer the high voltage without trouble. Further, if such M0 wires 301f that are short-circuited to the gate electrode 203 are formed, such M0 wires 301f will function as shield lines for any wires in a layer above them. This will give more design arbitrariness in the drawing layout for upper layer wires.

Further, supplying the same voltage as supplied to the M0 wires 301f also to the M0 wire 301d that is not connected to the contact CT of the transfer transistor QNi enables the source diffused region 201c to have a larger area therein that is prevented formation of a depletion region. As a result, the advantage of transferring the high voltage will be more remarkable. Furthermore, if such an M0 wire 301d is formed, it will function as a shield line for any wire in a layer above it. This will give more design arbitrariness in the drawing layout for upper layer wires.

The number of transfer transistors QN provided in the row decoder circuit needs to be the same as the total number of control gate lines (word lines) and selector gate lines, which easily exceeds 1,000. This huge number of transfer transistors QN have to be provided within a limited region, which makes the M0 wires 301 considerably complicated. The present embodiment allows the M0 wires 301a to 301c, 301e and 301g provided in the regions AR1 to AR3, AR5 and AR7 other than the regions AR4 and AR6 to be supplied with any voltage. As will be clear from the results of comparative examples to be described later, a high voltage can be transferred even under application of a voltage of approximately 25V to the M0 wires 301a to 301c, 301e and 301g. That is, signal input nodes CGD to CGDn to which a high voltage is applied or the like may be provided on the M0 wires 301a to 301c, 301e and 301g. This will give more arbitrariness in the layout of the transfer transistors QN.

COMPARATIVE EXAMPLES

Figure 7A:
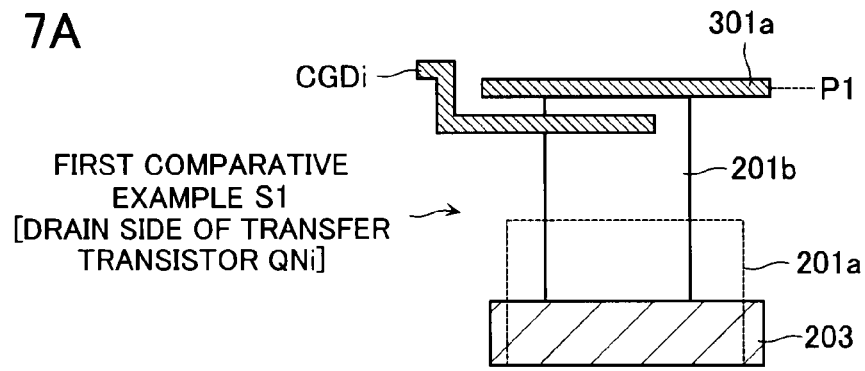
FIG. 7A shows plan diagrams of configurations of the transfer transistor QNi according to comparative examples.
Figure 7A:
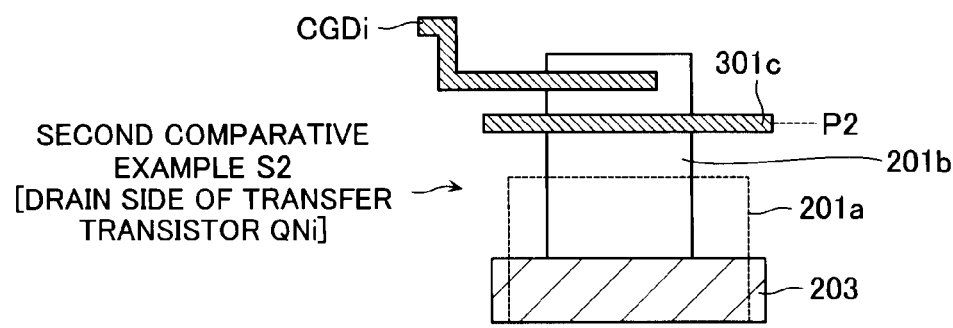
Figure 7A:
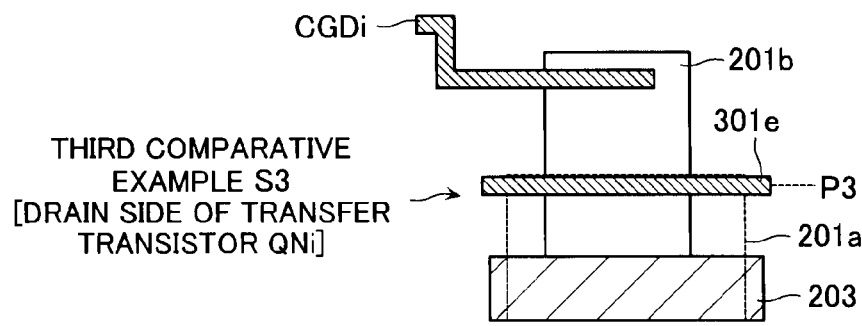
Figure 7A:
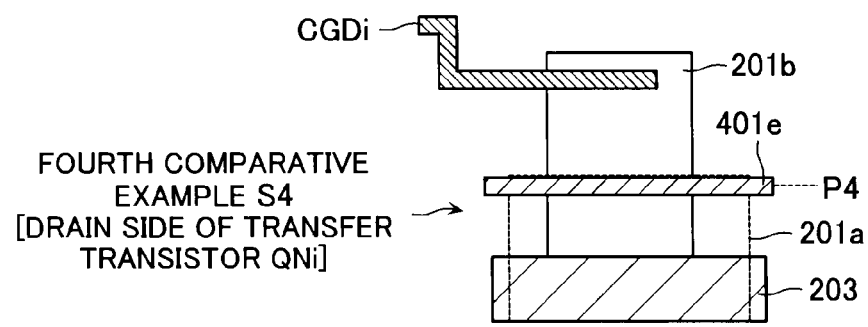
Figure 7B:
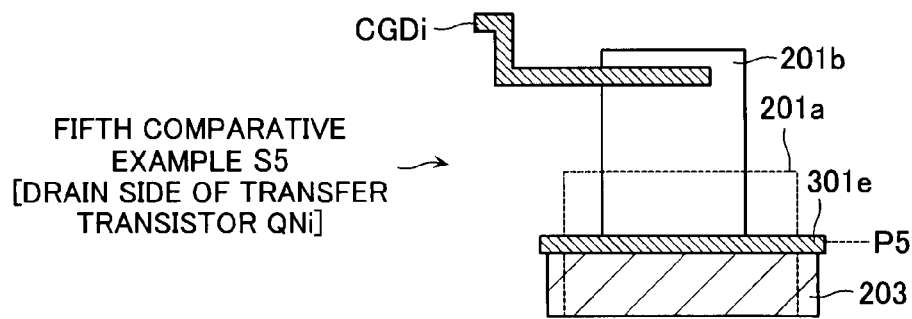
FIG. 7B shows plan diagrams of configurations of the transfer transistor QNi according to comparative examples.
Figure 7B:
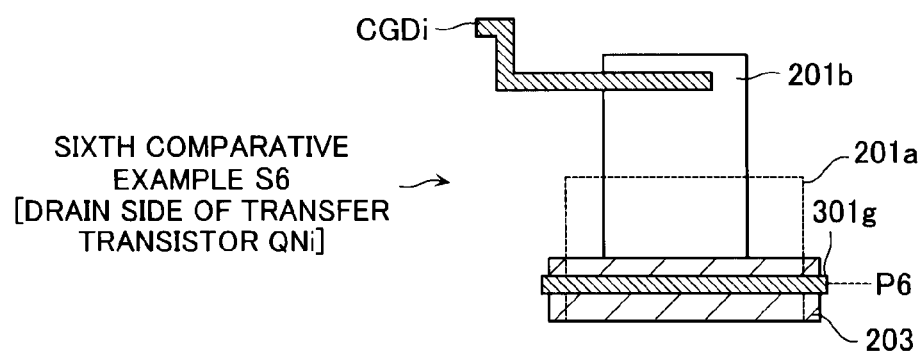
Figure 7B:
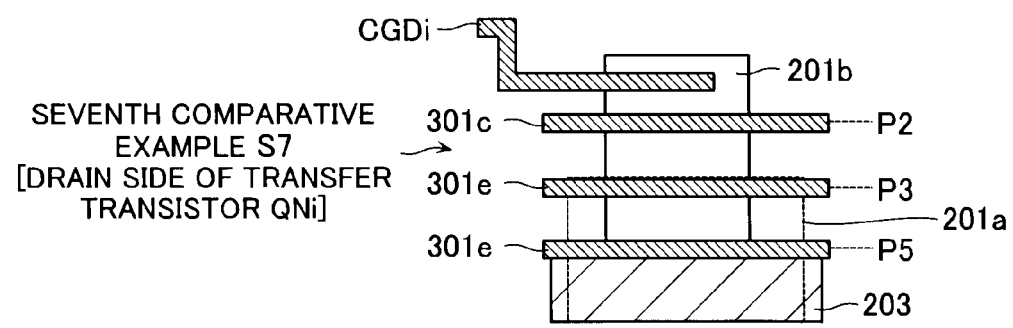
Figure 7B:
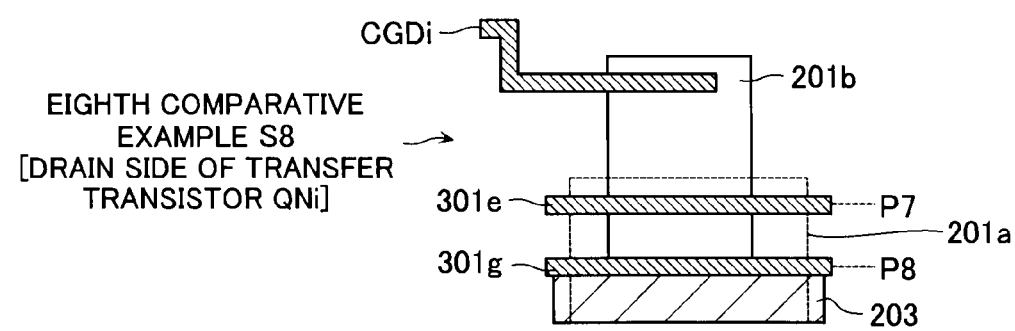
Figure 7D:
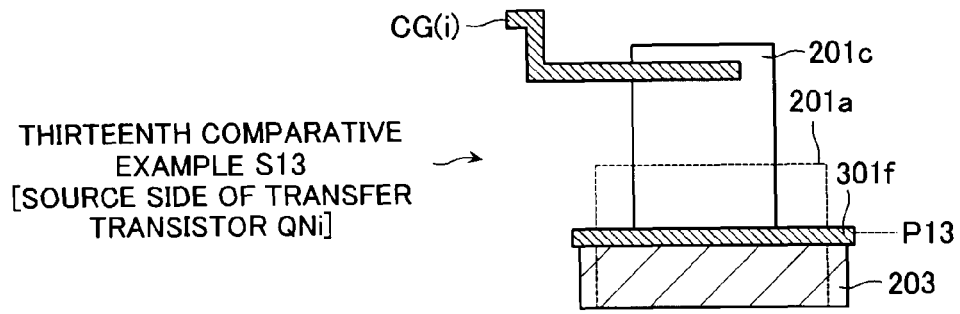
FIG. 7D shows plan diagrams of configurations of the transfer transistor QNi according to comparative examples.
Figure 7D:
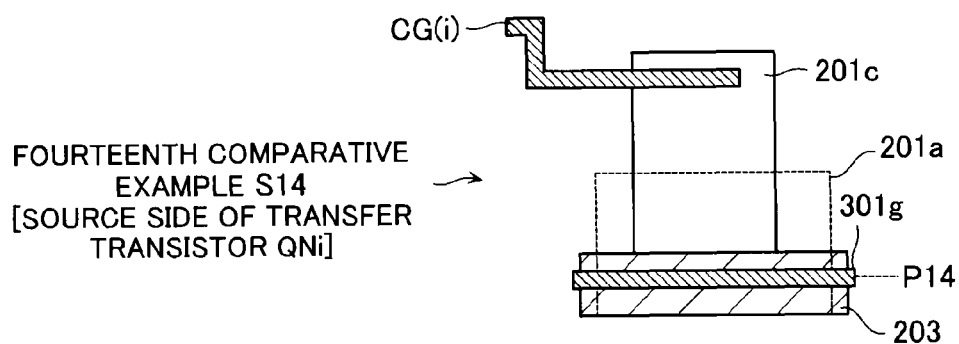
Figure 7D:
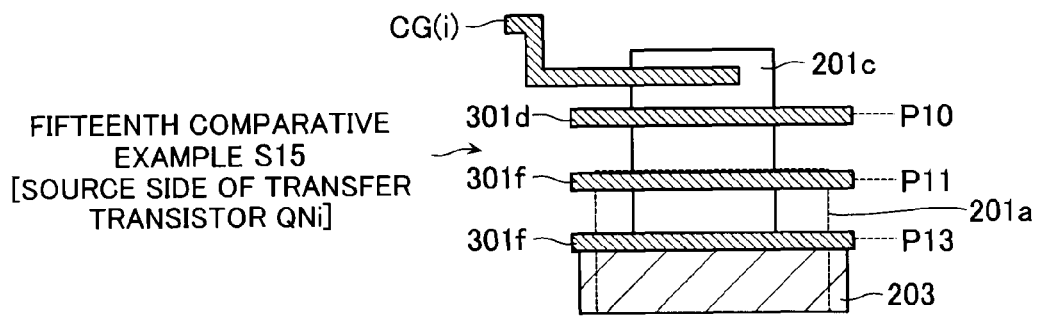
Figure 7D:
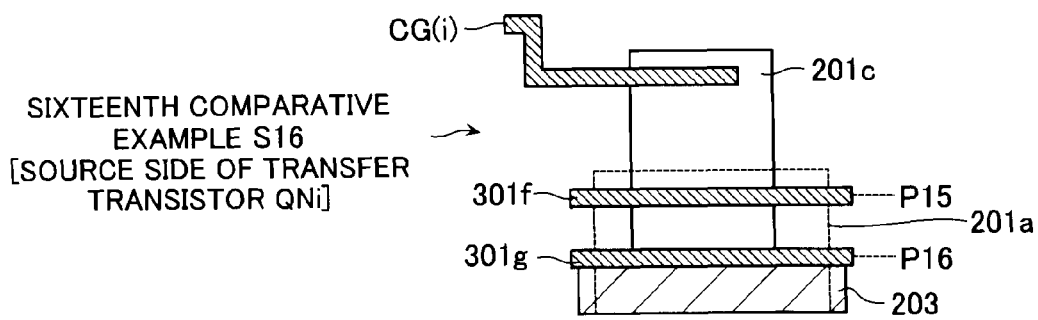

Next, with reference to FIG. 7A to FIG. 7D, a variation rate of an ON current Ion of the transfer transistor QNi when a voltage is applied to the M0 wire 301 or the M1 wire 401 will be compared among the first to sixteenth comparative examples. The first to eighth comparative examples are for measuring the influence of the M0 wires 301 and the M1 wires 401 located at the drain side of the transfer transistor QNi. The ninth to sixteenth comparative examples are for measuring the influence of the M0 wires 301 and the M1 wires 401 located at the source side of the transfer transistor QNi. FIG. 7A to FIG. 7D are diagrams showing the configurations of the first to sixteenth comparative examples. FIG. 7A and FIG. 7B show the drain side of the transfer transistor QNi, and FIG. 7C and FIG. 7D show the source side of the transfer transistor QNi.

First Comparative Example

Drain Side

In the first comparative example, as shown at a symbol S1 of FIG. 7A, an M0 wire 301a is formed at a position P1 that is above the element isolating region (insulating layer) adjoining the drain diffused region 201b. In the first comparative example, neither M0 wires 301 nor M1 wires 401 are formed except the M0 wire 301a at the position P1.

In this first comparative example, the ON current Ion of the transfer transistor QNi was measured while the voltage applied to the M0 wire 301a at the position P1 was changed from 25V through −5V. This measurement was carried out by setting the junction between the back gate (the p-type silicon substrate 11; it is below the same) and the source to a voltage Vbs=−22V, −24V, and −26V.

As a result of the measurement, the variation of the ON current Ion of the transfer transistor QNi, due to a change of the voltage applied to the M0 wire 301a at the position P1 (from 25V to 0V), was approximately +0.2%. That is, the ON current Ion does not substantially vary depending on the voltage applied to the M0 wire 301a at the position P1.

Second Comparative Example

Drain Side

In the second comparative example, as shown at a symbol S2 of FIG. 7A, an M0 wire 301c is formed at a position P2 that is above the drain diffused region 201b and not above the base diffused region 201a. In the second comparative example, neither M0 wires 301 nor M1 wires 401 are formed except the M0 wire 301c at the position P2.

In the configuration of the above second comparative example, the variation of the ON current Ion of the transfer transistor QNi was measured in a similar manner to the first comparative example. As a result of the measurement, the variation of the ON current Ion of the transfer transistor QNi, due to a change of the voltage applied to the M0 wire 301c at the position P2 (from 25V to 0V), was approximately +0.2%. That is, the ON current Ion does not substantially vary depending on the voltage applied to the M0 wire 301c at the position P2.

Third Comparative Example

Drain Side

In the third comparative example, as shown at a symbol S3 of FIG. 7A, an M0 wire 301e is formed at a position P3 that is above the drain diffused region 201b and above an end of the base diffused region 201a. In the third comparative example, neither M0 wires 301 nor M1 wires 401 are formed except the M0 wire 301e at the position P3.

In the configuration of the above third comparative example, the variation of the ON current Ion of the transfer transistor QNi was measured in a similar manner to the first comparative example. As a result of the measurement, the variation of the ON current Ion of the transfer transistor QNi, due to a change of the voltage applied to the M0 wire 301e at the position P3 (from 25V to 0V), was approximately +0.3%. That is, the ON current does not substantially vary depending on the voltage applied to the M0 wire 301e at the position P3.

Fourth Comparative Example

Drain Side

In the fourth comparative example, as shown at a symbol S4 of FIG. 7A, an M1 wire 401e is formed at a position P4 that is above the drain diffused region 201b and above an end portion of the base diffused region 201a. The M1 wire 401e is formed in a layer above M0 wires 301. In the fourth comparative example, neither M0 wires 301 nor M1 wires 401 are formed except the M1 wire 401e at the position P4.

In the configuration of the above fourth comparative example, the variation of the ON current Ion of the transfer transistor QNi was measured in a similar manner to the first comparative example. As a result of the measurement, the variation of the ON current Ion of the transfer transistor QNi, due to a change of the voltage applied to the M1 wire 401e at the position P4 (from 25V to 0V), was approximately +0.6%. That is, the ON current Ion does not substantially vary depending on the voltage applied to the M1 wire 401e at the position P4.

Fifth Comparative Example

Drain Side

In the fifth comparative example, as shown at a symbol S5 of FIG. 7B, an M0 wire 301e is formed at a position P5 that is above the drain diffused region 201b and above a portion of the base diffused region 201a adjoining the gate electrode 203. In the fifth comparative example, neither M0 wires 301 nor M1 wires 401 are formed except the M0 wire 301e at the position P5.

In the configuration of the above fifth comparative example, the variation of the ON current Ion of the transfer transistor QNi was measured in a similar manner to the first comparative example. As a result of the measurement, the variation of the ON current Ion of the transfer transistor QNi, due to a change of the voltage applied to the M0 wire 301e at the position P5 (from 25V to 0V), was approximately +0.1%. That is, the ON current Ion does not substantially vary depending on the voltage applied to the M0 wire 301e at the position P5.

Sixth Comparative Example

Drain Side

In the sixth comparative example, as shown at a symbol S6 of FIG. 7B, an M0 wire 301g is formed at a position P6 that is above the base diffused region 201a and above the gate electrode 203. The position P6 is located at a predetermined distance from an end of the gate electrode 203 that is closer to the drain diffused region 201b. In the sixth comparative example, neither M0 wires 301 nor M1 wires 401 are formed except the M0 wire 301g at the position P6.

In the configuration of the above sixth comparative example, the variation of the ON current Ion of the transfer transistor QNi was measured in a similar manner to the first comparative example. As a result of the measurement, the variation of the ON current Ion of the transfer transistor QNi, due to a change of the voltage applied to the M0 wire 301g at the position P6 (from 25V to 0V), was approximately +0.4%. That is, the ON current Ion does not substantially vary depending on the voltage applied to the M0 wire 301g at the position P6.

Seventh Comparative Example

Drain Side

In the seventh comparative example, as shown at a symbol S7 of FIG. 7B, M0 wires 301c and 301e are formed at the aforementioned positions P2, P3, and P5 above the drain diffused region 201b. In the seventh comparative example, neither M0 wires 301 nor M1 wires 401 are formed except the M0 wires 301c and 301e at the positions P2, P3, and P5.

In the configuration of the above seventh comparative example, the variation of the ON current Ion of the transfer transistor QNi was measured in a similar manner to the first comparative example. As a result of the measurement, the variation of the ON current Ion of the transfer transistor QNi, due to a change of the voltage applied to the M0 wires 301c and 301e at the positions P2, P3, and P5 (from 25V to 0V), was approximately +0.1%. That is, the ON current Ion does not substantially vary depending on the voltage applied to the M0 wires 301c and 301e at the positions P2, P3, and P5.

Eighth Comparative Example

Drain Side

In the eighth comparative example, as shown at a symbol S8 of FIG. 7B, an M0 wire 301e is formed at a position P7 that is above the drain diffused region 201b and above the base diffused region 201a. The position P7 is located at a predetermined distance from an end of the base diffused region 201a.

In addition, as shown at the symbol S8 of FIG. 7B, an M0 wire 301g is formed at a position P8 that is above the base diffused region 201a and above the gate electrode 203. The position P8 is located at one end of the gate electrode 203 that is closer to the drain diffused region 201b. In the eighth comparative example, neither M0 wires 301 nor M1 wires 401 are formed except the M0 wires 301e and 301g at the positions P7 and P8.

In the configuration of the above eighth comparative example, the variation of the ON current Ion of the transfer transistor QNi was measured in a similar manner to the first comparative example. As a result of the measurement, the variation of the ON current Ion of the transfer transistor QNi, due to a change of the voltage applied to the M0 wires 301e and 301g at the positions P7 and P8 (from 25V to 0V), was approximately +0.3%. That is, the ON current Ion does not substantially vary depending on the voltage applied to the M0 wires 301e and 301g at the positions P7 and P8.

As shown in the first to eighth comparative examples, the ON current of the transfer transistor QNi does not substantially vary depending on the voltage applied to the M0 wires 301 and M1 wires 401 which are located at the drain side of the transfer transistor QNi. Hence, it is clear that a ground voltage or any other predetermined voltages can be applied to the M0 wires 301 and M1 wires 401 located at the drain side of the transfer transistor QNi.

Ninth Comparative Example

Source Side

In the ninth comparative example, as shown at a symbol S9 of FIG. 7C, an M0 wire 301b is formed at a position P9 that is above the element isolating region (insulating layer) adjoining the source diffused region 201c. In the ninth comparative example, neither M0 wires 301 nor M1 wires 401 are formed except the M0 wire 301b at the position P9.

In this ninth comparative example, the ON current Ion of the transfer transistor QNi was measured while the voltage applied to the M0 wire 301b at the position P9 was changed from 25V through −5V. This measurement was carried out by setting the junction between the back gate and the source to a voltage Vbs=−22V, −24V, and −26V.

As a result of the measurement, the variation of the ON current Ion of the transfer transistor QNi, due to a change of the voltage applied to the M0 wire 301b at the position P9 (from 25V to 0V), was approximately −0.5%. That is, the ON current Ion does not substantially vary depending on the voltage applied to the M0 wire 301b at the position P9.

Tenth Comparative Example

Source Side

In the tenth comparative example, as shown at a symbol S10 of FIG. 7C, an M0 wire 301d is formed at a position P10 that is above the source diffused region 201c and not above the base diffused region 201a. In the tenth comparative example, neither M0 wires 301 nor M1 wires 401 are formed except the M0 wire 301d at the position P10.

In the configuration of the above tenth comparative example, the variation of the ON current Ion of the transfer transistor QNi was measured in a similar manner to the ninth comparative example. As a result of the measurement, the variation of the ON current Ion of the transfer transistor QNi, due to a change of the voltage applied to the M0 wire 301*d* at the position P10 (from 25V to 0V), was approximately −4.6%. That is, it can be said that the ON current decreases depending on the voltage applied to the M0 wire 301*d* at the position P10.

Eleventh Comparative Example

Source Side

In the eleventh comparative example, as shown at a symbol S11 of FIG. 7C, an M0 wire 301*f* is formed at a position P11 that is above the source diffused region 201*c* and above an end of the base diffused region 201*a*. In the eleventh comparative example, neither M0 wires 301 nor M1 wires 401 are formed except the M0 wire 301*f* at the position P11.

In the configuration of the above eleventh comparative example, the variation of the ON current Ion of the transfer transistor QNi was measured in a similar manner to the ninth comparative example. As a result of the measurement, the variation of the ON current Ion of the transfer transistor QNi, due to a change of the voltage applied to the M0 wire 301*f* at the position P11 (from 25V to 0V), was approximately −5.6%. That is, the ON current Ion greatly decreases as the voltage applied to the M0 wire 301*f* at the position P11 is reduced to 0V.

Twelfth Comparative Example

Source Side

In the twelfth comparative example, as shown at a symbol S12 of FIG. 7C, an M1 wire 401*f* is formed at a position P12 that is above the source diffused region 201*c* and above an end portion of the base diffused region 201*a*. The M1 wire 401*f* is formed in a layer above M0 wires 301. In the twelfth comparative example, neither M0 wires 301 nor M1 wires 401 are formed except the M1 wire 401*f* at the position P12.

In the configuration of the above twelfth comparative example, the variation of the ON current Ion of the transfer transistor QNi was measured in a similar manner to the ninth comparative example. As a result of the measurement, the variation of the ON current Ion of the transfer transistor QNi, due to a change of the voltage applied to the M1 wire 401*f* at the position P12 (from 25V to 0V), was approximately −0.5%. That is, the ON current Ion does not substantially vary depending on the voltage applied to the M1 wire 401*f* at the position P12.

Thirteenth Comparative Example

Source Side

In the thirteenth comparative example, as shown at a symbol S13 of FIG. 7D, an M0 wire 301*f* is formed at a position P13 that is above the source diffused region 201*c* and above a portion of the base diffused region 201*a* adjoining the gate electrode 203. In the thirteenth comparative example, neither M0 wires 301 nor M1 wires 401 are formed except the M0 wire 301*f* at the position P13.

In the configuration of the above thirteenth comparative example, the variation of the ON current Ion of the transfer transistor QNi was measured in a similar manner to the ninth comparative example. As a result of the measurement, the variation of the ON current Ion of the transfer transistor QNi, due to a change of the voltage applied to the M0 wire 301*f* at the position P13 (from 25V to 0V), was approximately −5.7%. That is, the ON current Ion greatly decreases as the voltage applied to the M0 wire 301*f* at the position P13 is reduced to 0V.

Fourteenth Comparative Example

Source Side

In the fourteenth comparative example, as shown at a symbol S14 of FIG. 7D, an M0 wire 301*g* is formed at a position P14 that is above the base diffused region 201*a* and above the gate electrode 203. The position P14 is located at a predetermined distance from one end of the gate electrode 203 that is closer to the source diffused region 201*c*. In the fourteenth comparative example, neither M0 wires 301 nor M1 wires 401 are formed except the M0 wire 301*g* at the position P14.

In the configuration of the above fourteenth comparative example, the variation of the ON current Ion of the transfer transistor QNi was measured in a similar manner to the ninth comparative example. As a result of the measurement, the variation of the ON current Ion of the transfer transistor QNi, due to a change of the voltage applied to the M0 wire 301*g* at the position P14 (from 25V to 0V), was approximately −3.3%. That is, the ON current Ion does not substantially vary depending on the voltage applied to the M0 wire 301*g* at the position P14.

Fifteenth Comparative Example

Source Side

In the fifteenth comparative example, as shown at a symbol S15 of FIG. 7D, M0 wires 301*d* and 301*f* are formed at the aforementioned positions P10, P11, and P13 above the source diffused region 201*c*. In the fifteenth comparative example, neither M0 wires 301 nor M1 wires 401 are formed except the M0 wires 301*d* and 301*f* at the positions P10, P11, and P13.

In the configuration of the above fifteenth comparative example, the variation of the ON current Ion of the transfer transistor QNi was measured in a similar manner to the ninth comparative example. As a result of the measurement, the variation of the ON current Ion of the transfer transistor QNi, due to a change of the voltage applied to the M0 wires 301*d* and 301*f* at the positions P10, P11, and P13 (from 25V to 0V), was approximately −13.8%. That is, the ON current Ion greatly decreases as the voltage applied to the M0 wires 301*d* and 301*f* at the positions P10, P11, and P13 is reduced to 0V.

Sixteenth Comparative Example

Source Side

In the sixteenth comparative example, as shown at a symbol S16 of FIG. 7D, an M0 wire 301*f* is formed at a position P15 that is above the source diffused region 201*c* and above the base diffused region 201*a*. The position P15 is located at a predetermined distance from an end of the base diffused region 201*a*.

In addition, as shown at the symbol S16 of FIG. 7D, an M0 wire 301*g* is formed at a position P16 that is above the base diffused region 201*a* and above the gate electrode 203. The position P16 is located at one end of the gate electrode 203 that is closer to the source diffused region 201*c*. In the sixteenth comparative example, neither M0 wires 301 nor M1 wires 401 are formed except the M0 wires 301*f* and 301*g* at the positions P15 and P16.

In the configuration of the above sixteenth comparative example, the variation of the ON current Ion of the transfer transistor QNi was measured in a similar manner to the ninth comparative example. As a result of the measurement, the variation of the ON current Ion of the transfer transistor QNi, due to a change of the voltage applied to the M0 wires 301f and 301g at the positions P15 and P16 (from 25V to 0V), was approximately −14.5%. That is, the ON current Ion greatly decreases as the voltage applied to the M0 wires 301f and 301g at the positions P15 and P16 is reduced to 0V.

As shown in the ninth to sixteenth comparative examples, at the source side of the transfer transistor QNi, in the case where M0 wires 301d and 301f are formed at the positions P10, P11, P13, and P15 (in the regions AR4 and AR6 shown in FIG. 6C), the ON current Ion of the transfer transistor QNi decreases as the voltage applied to these M0 wires 301d and 301f is reduced. Particularly, in the case where M0 wires 301 are formed at the positions P11, P13, and P15 above the source diffused region 201c and above the base diffused region 201a (in the region AR6 shown in FIG. 6C), the ON current Ion of the transfer transistor QNi greatly decreases as the voltage applied to these M0 wires 301f is reduced. Hence, the M0 wires 301f according to the embodiment of the present invention are connected to the gate electrode 203 through the short-circuiting wire 302 to suppress the ON current Ion of the transfer transistor QNi from decreasing. Applying the technique to also the M0 wire 301d that is not connected to the contact CT of the transfer transistor QNi will make this effect more remarkable. On the other hand, it is clear that a ground voltage or any other predetermined voltage can be applied to the M1 wires 401 which are located at the source side of the transfer transistor QNi.

Particularly, in a writing operation to the memory cells M1 to Mn, the wire (lead wire) connected to the current path of the transfer transistor QNS is set to a ground potential. Therefore, it is preferred that the lead wire be not disposed at the source side (in the regions AR4 and AR6) of the transfer transistor QNi and on the same layer as the M0 wires 301. That is, it is preferred that the lead wire be disposed at the drain side (in the regions AR3 and AR5) of the transfer transistor QNi or above the element isolating region STI and on the same layer as the M0 wires 301. Alternatively, it is preferred that the lead wire be disposed in the same layer as the M1 wires 401 above the M0 wires 301.

OTHER EMBODIMENTS

Figure 8:
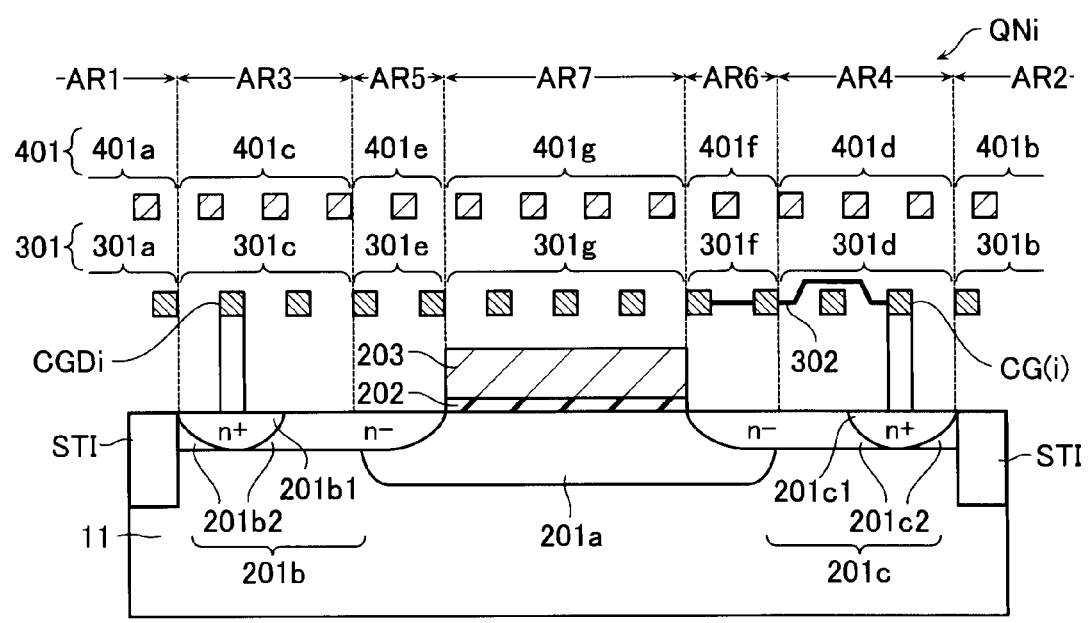
FIG. 8 is a cross section of the transfer transistor QNi according to other embodiment.

Though embodiments of the invention having been explained, the present invention is not limited to threes embodiment, but various modifications, additions, etc. may be made thereonto within the scope of the spirit of the invention. For example, in the above-described embodiment, the M0 wires 301f are connected to the gate electrode 203 through the short-circuiting wire 302. However, the M0 wires 301f may be short-circuited to the source diffused region 201c with the short-circuiting wire 302 such that the same voltage as to the source diffused region 201c is applied thereto in FIG. 8.

Furthermore, a predetermined voltage for preventing formation of a depletion region in the source diffused region 201c when the transfer transistor QNi transfers a voltage used for writing may be supplied to the M0 wires 301f independent of the gate electrode 203 or the source diffused region 201c.

What is claimed is:

1. A nonvolatile semiconductor memory device, comprising:
a memory cell array having memory cells arranged therein, the memory cells being configured to store data in a nonvolatile manner; and
a plurality of transfer transistors configured to transfer a voltage supplied for writing data in the memory cells, the plurality of transfer transistors including:
a gate electrode formed above a semiconductor substrate via a gate insulating film;
a first diffused region formed in a surface of the semiconductor substrate located under the gate electrode;
a second diffused region formed in a surface of the semiconductor substrate adjoining the first diffused region on a first side of the first diffused region; and
a third diffused region formed in a surface of the semiconductor substrate adjoining the first diffused region on a second side of the first diffused region, the first side and the second side being opposite,
the third diffused region including an overlapping region overlapping the first diffused region, a first wire being disposed above the overlapping region, the first wire being supplied with at least a predetermined voltage for preventing formation of a depletion region in the third diffused region when the transfer transistor transfers the voltage used for writing, the first wire extending in a direction parallel to the semiconductor substrate.

2. The nonvolatile semiconductor memory device according to claim 1, wherein the first wire is supplied with a certain voltage together with the gate electrode being supplied with it.

3. The nonvolatile semiconductor memory device according to claim 2, wherein the gate electrode is short-circuited to the first wire.

4. The nonvolatile semiconductor memory device according to claim 1, wherein gates of the plurality of transfer transistors are commonly connected in a shape of a straight line, and
the first wire is disposed to continuously pass through the overlapping region of the plurality of transfer transistors.

5. The nonvolatile semiconductor memory device according to claim 4, wherein the third diffused region is short-circuited to the first wire.

6. The nonvolatile semiconductor memory device according to claim 1, further comprising a second wire disposed above the second diffused region, the second wire being supplied with a ground voltage at least when the transfer transistor transfers the voltage used for writing.

7. The nonvolatile semiconductor memory device according to claim 1, further comprising a third wire only disposed above the third diffused region, the third wire being supplied with at least a predetermined voltage for preventing formation of a depletion region in the third diffused region when the transfer transistor transfers the voltage used for writing.

8. The nonvolatile semiconductor memory device according to claim 1, wherein a fourth wire is disposed above the first wire, the fourth wire is supplied with a ground voltage at least when the transfer transistor transfers the voltage used for writing.

9. The nonvolatile semiconductor memory device according to claim 1, further comprising a first element isolating region disposed to adjoin the second diffused region, and a second wire is disposed above the first element isolating region.

10. The nonvolatile semiconductor memory device according to claim 1, further comprising a second element isolating region disposed to adjoin the third diffused region, and a second wire is disposed above the second element isolating region.

11. The nonvolatile semiconductor memory device according to claim 6, wherein the second wire is formed in a region that is above the overlapping region.

12. The nonvolatile semiconductor memory device according to claim 1, further comprising a row decoder configured to select a word line provided on the memory cell array, wherein the transfer transistors are transfer transistors included in the row decoder.

13. The nonvolatile semiconductor memory device according to claim 1, wherein a plurality of the memory cells are connected in series to form a NAND cell.

14. The nonvolatile semiconductor memory device according to claim 13, further comprising:

a first selector transistor having one end connected to a drain side of the NAND cell; and a second selector transistor having one end connected to a source side of the NAND cell.

15. The nonvolatile semiconductor memory device according to claim 14, further comprising a fifth wire connected to a current path of the second selector transistor, and an element isolating region provided to adjoin the second diffused region and the third diffused region, and the fifth wire is disposed in the same layer as the first wire and above the second diffused region or above the element isolating region of the plurality of transfer transistors.

16. The nonvolatile semiconductor memory device according to claim 1, wherein the second diffused region includes a second higher concentration region and a second lower concentration region having a concentration lower than that of the second higher concentration region, and the second wire is connected to the second higher concentration region through a contact.

17. The nonvolatile semiconductor memory device according to claim 1, wherein the third diffused region includes a third higher concentration region and a third lower concentration region having a concentration lower than that of the third higher concentration region, and the first wire is connected to the third higher concentration region through a contact.

* * * * *